(12) United States Patent
Minogue

(10) Patent No.: US 6,958,717 B1
(45) Date of Patent: Oct. 25, 2005

(54) METHOD AND APPARATUS FOR INTERCONNECTING ANALOG AND DIGITAL SECTIONS OF A/D AND D/A CONVERTERS

(75) Inventor: Paschal T. Minogue, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/647,713

(22) Filed: Aug. 25, 2003

(51) Int. Cl.[7] ................................................ H03M 7/20
(52) U.S. Cl. ........................ 341/102; 341/101; 341/100
(58) Field of Search ................................. 341/143, 144, 341/155, 101, 100, 102, 50; 257/401

(56) References Cited

U.S. PATENT DOCUMENTS

| | | | |
|---|---|---|---|
| 5,103,274 A | * | 4/1992 | Tang et al. .................. 257/401 |
| 6,005,505 A | * | 12/1999 | Linz ............................ 341/143 |
| 6,140,946 A | * | 10/2000 | Desrosiers et al. .......... 341/100 |
| 6,307,493 B1 | * | 10/2001 | Nestler ........................ 341/143 |
| 6,326,912 B1 | * | 12/2001 | Fujimori ..................... 341/143 |
| 6,340,940 B1 | * | 1/2002 | Melanson .................... 341/143 |
| 6,404,368 B1 | * | 6/2002 | Yamaguchi .................. 341/143 |
| 6,441,759 B1 | * | 8/2002 | Raghavan et al. ........... 341/143 |
| 6,600,789 B1 | * | 7/2003 | Lipasti et al. ................ 375/247 |
| 6,606,043 B2 | * | 8/2003 | Reefman ..................... 341/143 |

* cited by examiner

*Primary Examiner*—Peguy JeanPierre
(74) *Attorney, Agent, or Firm*—Wolf, Greenfield & Sacks, P.C.

(57) ABSTRACT

Input and output sections of an analog-to-digital converter are joined by an interface. In the input section, an analog input signal is converted to a multi-bit digital signal before being converted, by a noise-shaping converter such as a sigma-delta modulator, to a lower bit signal. The lower bit signal is carried across the interface before being converted, by a digital filter to recover the original multi-bit signal. The same principle is applied to the input and output sections of a digital-to-analog converter.

42 Claims, 3 Drawing Sheets

METHOD AND APPARATUS FOR INTERCONNECTING ANALOG AND DIGITAL SECTIONS OF A/D AND D/A CONVERTERS

FIELD OF THE INVENTION

This invention relates to analog-to-digital and digital-to-analog converters.

BACKGROUND TO THE INVENTION

Analog-to-digital converters (ADCs) and digital-to-analog converters (DACs) are widely used in a range of equipment.

An increasing drive to integrate more functionality onto integrated circuits (ICs) has led to integrated circuits having a higher density layout and the introduction of IC manufacturing technologies with smaller geometries.

While high density, small geometry, manufacturing techniques can be tolerated by digital signals, they are not so well suited to analog signals. One solution to this is to partition those parts of an IC which process analog signals from those parts which process digital signals. This allows an analog 'front end' section to be formed using a relatively large manufacturing geometry and a digital 'back end' section to be formed using a smaller manufacturing geometry. The analog front end and digital back end can be formed on separate ICs which are connected to one another via a bus.

When an analog to digital converter is partitioned in this way, and the analog front end has a multi-bit converter, i.e., a converter which resolves an analog input signal into a multi-bit digital output signal, this requires the interface between the analog front end and digital back end to have a number of separate connections to accommodate the multi-bit signal. This incurs a penalty in package pin count, since it demands a wide data bus, and can also incur a penalty in signal performance due to more switching data outputs. An alternative solution is to convert the multi-bit signal into serial format. However, parallel to serial conversion requires a higher clock rate which may not be readily available and, even where it is available, may degrade performance.

The present invention seeks to provide an improved way of interconnecting the analog and digital sections of analog-to-digital and digital-to-analog converters.

SUMMARY OF THE INVENTION

A first aspect of the present invention provides an analog-to-digital converter comprising:
   a first section having a multi-bit analog to digital converter for receiving an analog input signal and generating an m-bit digital signal;
   an m-bit to n-bit converter (where m>n) for receiving the m-bit digital signal and for generating an n-bit digital output signal for outputting across an interface, wherein the m-bit to n-bit converter quantizes the m-bit signal to a lower resolution; and
   a second section having processing means which is arranged to receive the n-bit digital signal and to process the received signal to generate an output digital signal.

The use of a multi-bit analog-to-digital converter, such as a multi-bit sigma-delta modulator, at the input stage (i.e., first section) increases the overall performance of the converter compared to the use of a single-bit converter. This is because higher performance is more easily achieved by a multi-bit (sigma-delta) modulator than a single-bit (sigma-delta) modulator.

The use of an m-bit to n-bit converter reduces the number of physical connections that are required for the interface to a second section of the converter, while maintaining good performance. Preferably, the m-bit to n-bit converter is an m-bit to single-bit converter as this minimizes the connection requirements of the interface. Preferably, the rate at which the m-bit signal is received at the converter is the same as the rate at which the n-bit output signal is generated. This allows all transfers in the first section of the converter to occur at the same clock rate, which reduces interference.

Preferably, a second section of the converter comprises an n-bit to p-bit converter for receiving the n-bit digital signal from the interface and for generating a p-bit digital signal (n<p) at a higher resolution and a filter which filters the p-bit signal to generate a digital output. In this way a multi-bit signal can be recovered in the second section, if desired.

In a similar manner, a second aspect of the invention provides a digital-to-analog converter comprising:
   a first section having an input for receiving an s-bit digital signal from an interface and for generating a t-bit digital signal (where s<t) at a higher resolution; and
   a digital-to-analog converter which receives the t-bit digital signal and generates an analog output; and
   a second section connectable to said first section by said interface and having an input for receiving a digital signal, and a processor which receives the digital input signal and generates an s-bit digital output signal.

An input (i.e., first) section can be connected to the interface. The input section comprises an input for receiving a digital signal and an r-bit to s-bit converter (where r>s) for receiving an r-bit digital signal and for generating an s-bit output signal for outputting across the interface. The converter quantizes the r-bit signal to a lower resolution, preferably with the r-bit input signal being received by the converter at the same rate as the s-bit output signal is generated.

The processor(s) and converter(s), which reduce the number of transmitted bits at the input to the interface in both the analog-to-digital and digital-to-analog chains, are preferably noise-shaping converters such as sigma-delta modulators. The quantization noise which results from the further quantization of the multi-bit digital signals, before the signals are transmitted across the interface, is shaped out of the band of interest.

In both the case of the analog-to-digital and digital-to-analog converters, a first (input) section can be located on a first integrated circuit and the second (output) section can be located on a second integrated circuit. The first and second integrated circuits can be separately packaged or the first and second integrated circuits can be housed within a common package. It is preferred that the first and second integrated circuits are formed using manufacturing geometries which are different from one another, with the analog processing being performed on the integrated circuit with a coarser geometry than the integrated circuit which performs the majority of the digital processing. The input section of the analog-to-digital converter and output section of the digital-to-analog converter (i.e., mainly analog parts) can be commonly housed on an integrated circuit. Similarly, the output section of the analog-to-digital converter and input section of the digital-to-analog converter (i.e., mainly digital parts) can be commonly housed on a separate integrated circuit.

BRIEF DESCRIPTION OF THE DRAWINGS

Embodiments of the invention will be described with reference to the accompanying drawings in which.

DESCRIPTION OF PREFERRED EMBODIMENTS

Figure 1:
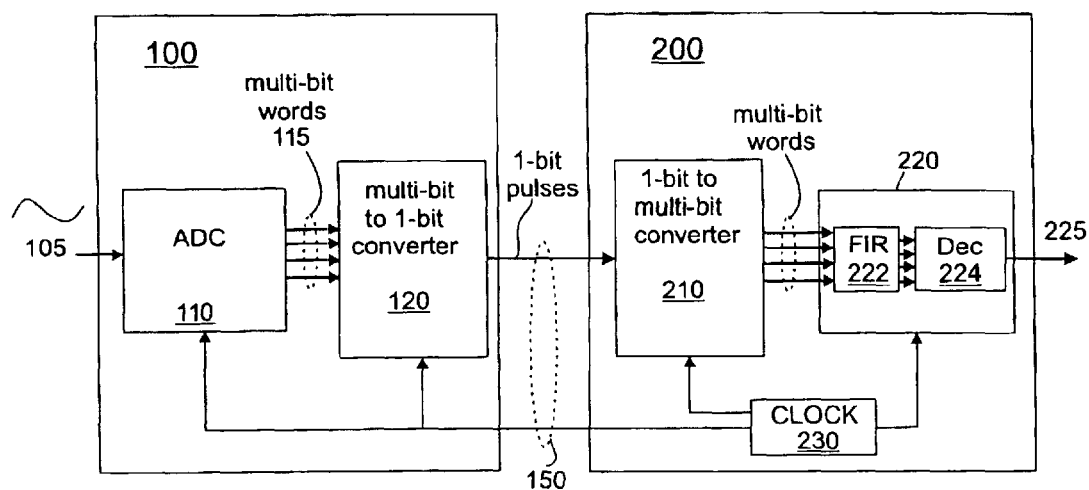
FIG. 1 shows an analog-to-digital converter in accordance with an embodiment of the invention.

FIG. 1 shows a first embodiment of the invention in which the functions of an analog to digital converter are split between a first integrated circuit (IC) 100 and a second integrated circuit 200. The first IC 100 comprises a multi-bit analog to digital converter 110 and a digital multi-bit to single-bit same rate converter 120, with the multi-bit output of the analog to digital converter 110 being fed to the input of the multi-bit to single-bit converter 120. Preferably, the multi-bit analog to digital converter 110 is a multi-bit Sigma-delta Modulator (SDM) and the multi-bit to single-bit converter 120 is a digital Sigma-delta modulator which acts on the digital words it receives. If a sigma-delta modulator is used for block 110 it is expected that the downstream processing chain in IC 200 will include filtering 222 which can be shared by the converter 210. The term 'same rate' means that the input and output sample rates of converter 120 are the same. Multi-bit words are received, in parallel, at the input to converter 120, at the same rate as single-bit pulses leave the converter. This differs from a parallel-to-serial converter where the output rate is higher than the input rate (e.g., for an m-bit parallel-to-serial converter the output is m times the rate of the input.) Converting from multi-bit to single-bit involves quantisation, and hence quantisation noise, but in a sigma-delta modulator this quantisation noise is shaped out of the frequency band of interest. Therefore, signal-to-noise performance is maintained in the bandwidth of interest.

In use, an analog signal is received at input 105 and converted to a multi-bit digital form by converter 110. Where the analog to digital converter is a multi-bit Sigma-delta Modulator, the output 115 from block 110 is a stream of multi-bit digital words. Each multi-bit word is proportional to the amplitude of the analog input signal. This multi-bit output is applied to the input of the multi-bit to single-bit converter 120. Converter 120 outputs a stream of one-bit pulses at the same rate as the multi-bit words are delivered to the input of converter 120. The density of the one-bit pulse stream emerging from converter 120 is proportional to the amplitude of the original analog input signal.

The one bit pulse stream is carried across a line of interface 150 to the second integrated circuit 200. Interface 150 can take the form of a bus which is realised as a number of tracks on the circuit board upon which IC 100 and IC 200 are mounted. Because the output of the first integrated circuit 100 is a one bit pulse stream, the requirements of the interface 150 need only comprise one line for carrying the pulse stream, together with some additional lines for carrying clock and control signals between the ICs.

The second integrated circuit 200 comprises a single-bit to multi-bit same rate converter 210 and digital decimation filtering 220. The single-bit to multi-bit converter 210 comprises a filter which receives the single-bit pulse stream from interface 150. It has the function of converting the single-bit bit pulse stream to a multi-bit pulse stream, with the rate at which single-bit pulses arrives at the input to converter 210 equalling the rate at which multi-bit words emerge, in parallel, from the output.

Assuming that one wants to recover the original multi-bit word width, i.e., the width of multi-bit words 115 in IC 100, converter 210 does this by digital filtering. The multi-bit output is then fed to digital decimation filtering 220.

Digital decimation filtering 220 typically comprises a digital filter, such as a digital Finite Impulse Response (FIR) filter 222, and a decimator 224, to generate an output 225 in the form of a series of digital multi-bit words of a desired size.

Single-bit to multi-bit converter 210 is shown separately from the digital decimation filtering 220. In reality, some of the functions of blocks 210 and 220 may be combined.

Clock signals are generated by a source 230 on IC 200. Alternatively, clock signals could come from another source external to both IC 200 and IC 100 on the host apparatus. An additional line of interface 150 carries the clock signal between IC 200 and IC 100. Each of the blocks on ICs 100, 200 receive the clock signal, or a divided down version of it.

The first integrated circuit 100 and second integrated circuit 200 are individually packaged devices. The first integrated circuit 100 is manufactured using a coarser geometry than the second integrated circuit 200, the courser geometry being better suited to the analog processing performed by stage 10. As an example, IC 100 can be manufactured using 0.351 μm double-poly, treble-metal (DPTM), 3.3V whereas IC 200 can be manufactured using a finer geometry such as 0.18 μm single-poly, penta-metal (SPPM), 1.8V. It will be appreciated that these geometries are only given for illustrative purposes.

The individual blocks shown in FIG. 1, i.e., the multi-bit sigma-delta modulator 110, multi-bit to single-bit converter 120, single-bit to multi-bit converter 210 and digital decimation filtering 220 are each known in themselves and will be familiar to one skilled in the art. As such, their internal workings do not need to be described any further.

Figure 2:
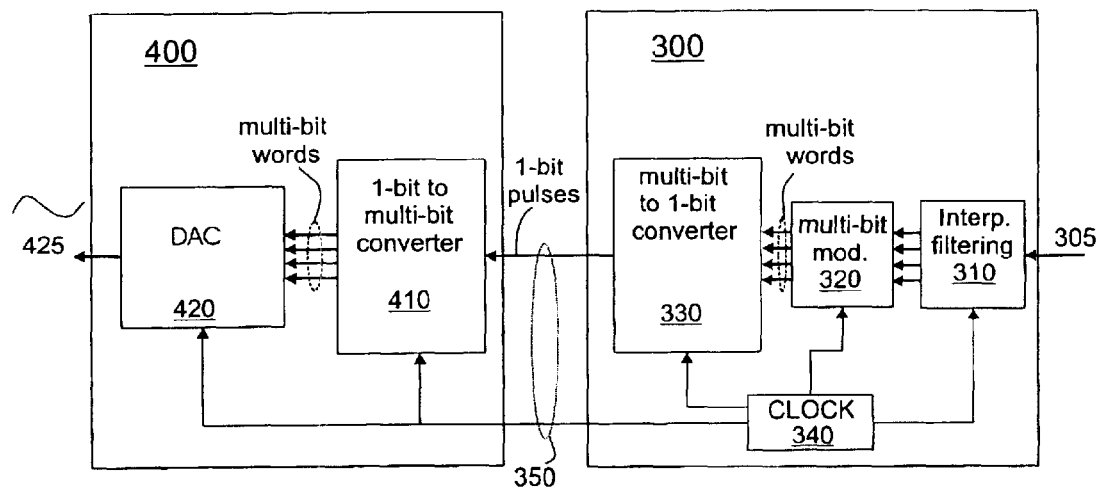
FIG. 2 shows a digital-to-analog converter in accordance with an embodiment of the invention.

FIG. 2 shows a second embodiment of the invention in which the functions of a digital to analog converter are split between two separate integrated circuits 300, 400. In use, a digital signal is received at input 305 and fed to a digital interpolation filter 310. The interpolator 310 increases the sample rate and usually does some filtering of 'images'. The interpolator is typically used but is not essential if the input sample rate is high enough to begin with. A digital multi-bit Sigma-delta Modulator (SDM) 320 receives the output of the interpolator 310 and generates a stream of multi-bit words. These multi-bit words are fed to a digital multi-bit to single-bit converter 330 which has the function of converting the multi-bit words to a one bit pulse stream, with the rate at which multi-bit words arrive at the converter 330, in parallel, equalling the rate at which single-bit pulses are output. Converter 330 is preferably a sigma-delta modulator and, as such, can have the same form as block 120 previously described.

The one bit pulse stream is carried across an interface 350 to the integrated circuit 400. As above, interface 350 can take the form of a bus which is realised as a number of tracks on the circuit board upon which IC 300 and IC 400 are mounted. Integrated circuit 400 comprises a digital single-bit to multi-bit converter 410 and an analog multi-bit digital to analog converter 420. Firstly, the single-bit to multi-bit converter 410 converts the one bit pulse stream, received on interface 350, to a multi-bit form. Single-bit pulses are received at the same rate as multi-bit words are output, in parallel. Converter 410 is implemented as a digital filter. The digital to analog converter 420 receives the multi-bit signal generated by converter 410 and generates an analog signal at analog output 425.

The digital to analog converter 420 can take any suitable form, such as a multi-bit current source I-DAC. Clock signals are generated by a source 340 on IC 300. An additional line of interface 350 carries the clock signal between IC 300 and IC 400. Each of the blocks on ICs 300, 400 receive the clock signal, or a divided down version of it. As an alternative, a clock signal may be received from an external source on the host apparatus.

Figure 3:
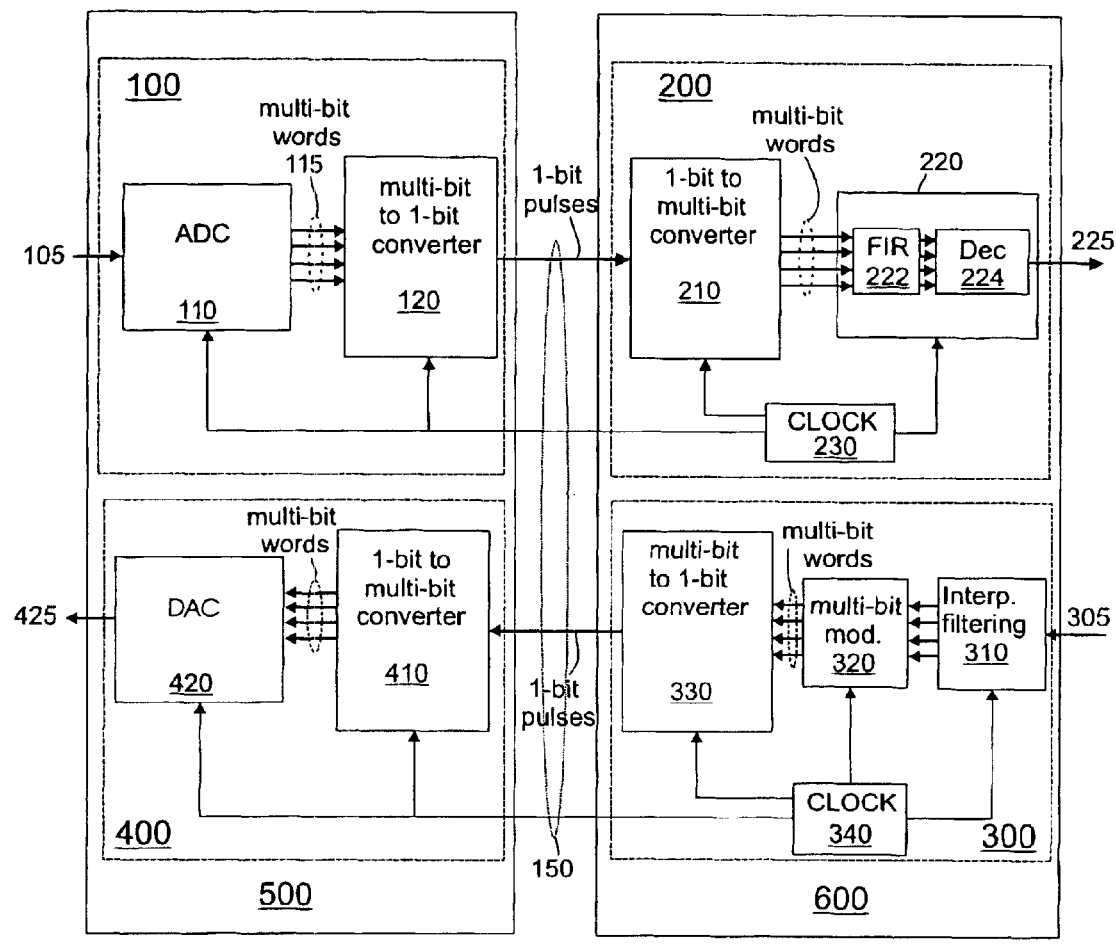
FIG. 3 shows an arrangement in which the analog-to-digital converter of FIG. 1 and the digital-to-analog converter of FIG. 2 are combined.
Figure 4:
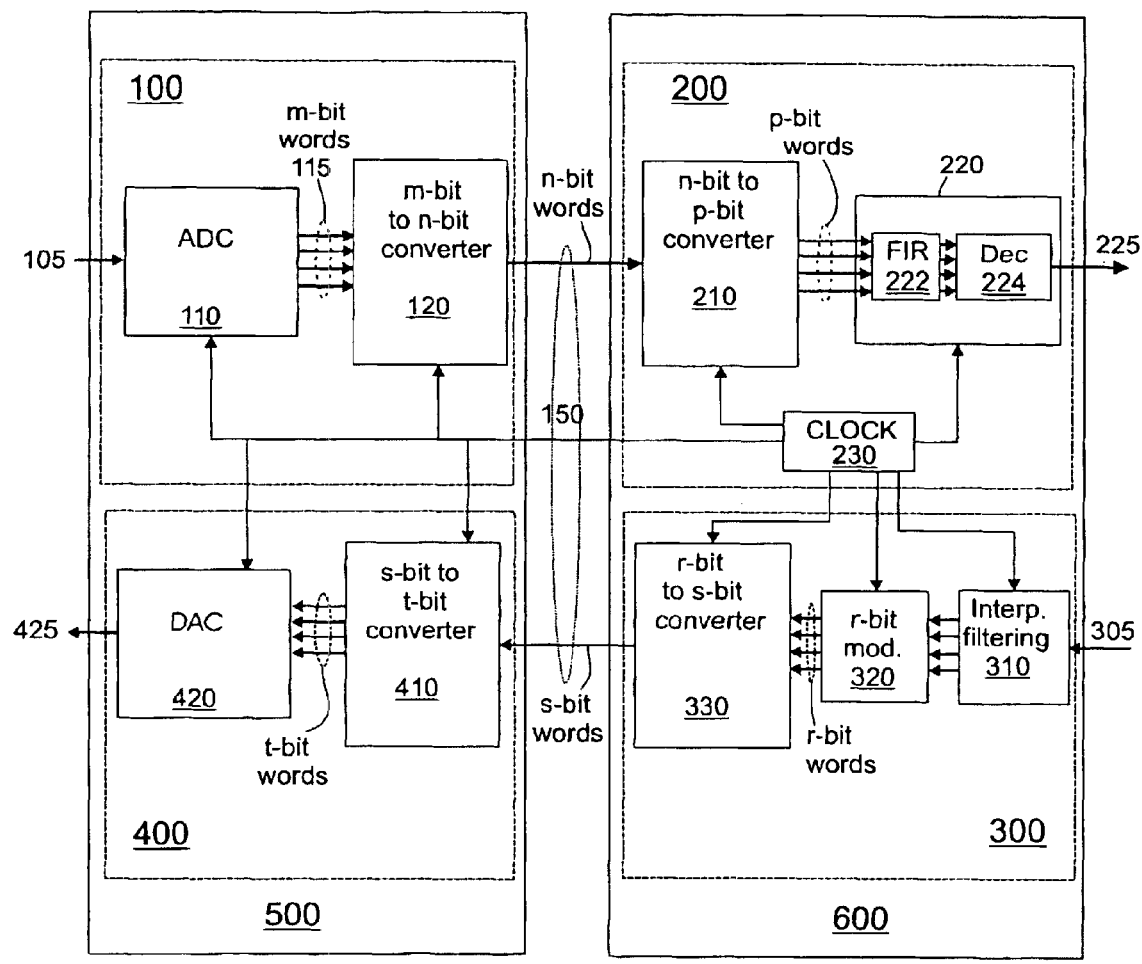
FIG. 4 shows a generalised embodiment of the invention.

The analog-to-digital chain (FIG. 1) and digital-to-analog chain (FIG. 2) have been shown separately. Separate pairs of integrated circuits may provide each of these functions. However, many applications have requirements for an analog input signal to be converted to the digital domain and for a digital input signal to be converted to the analog domain. As an example, in many digital audio applications there is a requirement to convert an analog audio input signal to digital form where it can be processed (compressed) and stored. The same application also has a requirement to retrieve a stored audio data in digital form, process the audio data, and convert the data to an analog audio signal for presentation to a listener. Therefore, as shown in FIG. 3, the respective analog parts of the analog-to-digital chain and digital-to-analog chain can be housed on the same IC, i.e., the blocks shown on ICs 100 and 400 can be housed on a single IC 500 with a set of analog inputs 105 and a set of analog outputs 425. Similarly, the respective digital parts of the ADC and DAC can be housed on the same IC, i.e., the blocks shown on ICs 200 and 300 can be housed on a single IC 600 with a set of digital outputs 225 and a set of digital inputs 305. FIG. 3 shows separate clock sources 230, 340 for the ADC and DAC channels, the clock signals being carried via additional lines of interface 150. In an alternative embodiment, and as shown in FIG. 4, a single source of clock signals 230 can be shared by all of the blocks on both ICs 500, 600.

For the purposes of illustrating the invention, and without limiting the scope in any way, example values for the items shown in FIGS. 1–3 will be given.

For the analog-to-digital converter:
  Sigma-delta Modulator clock rate: 6.144 MHz
  Multi-bit SDM (110) output word width: 6 bits
  Decimation filter output word width: 24 bits
For the digital-to-analog converter:
  Interpolation filter output word width: 24 bits
  Multi-bit SDM (320) output word width: 6 bits Although in this example the multi-bit SDMs in the analog-to-digital and digital-to-analog chains produce output words of the same size (6 bits), this is not essential. By keeping the words the same size, and assuming similar performance requirements for the ADC and DAC, there is a likelihood that block 120=block 330 and that block 210= block 410, thereby facilitating block re-use in the design of the ICs.

In the above description block 120 is a multi-bit to single-bit converter and block 210 is a single-bit to multi-bit converter. This is a preferred form of the invention as carrying a one bit pulse stream between ICs allows the interface 150 to have the minimum number of lines. FIG. 4 shows a generalised form of the invention. In its broadest form, converter 120 can have an m-bit input and an n-bit output, where m>n, and the converter 210 can have an n-bit input and an p-bit output. The interface requires n lines for carrying the n bit output. It will be appreciated that as the value of n increases, additional lines are required on interface 150. Although it is not essential that m=p, i.e., the number of bits at the input to converter 120 equals the number of bits at the output of block 210, it is convenient for them to be equal. By arranging m=p, it is easier to retrofit this improvement to an existing architecture, i.e., the design of an existing IC 100 which lacked block 120, and an existing IC 200 which lacked block 210 could be more easily modified to include blocks 120 and 210.

Similarly, in the digital-to-analog chain, the multi-bit to single-bit converter 330 can have an r-bit input and an s-bit output, where r>s, and the converter 410 can have an s-bit input and a t-bit output, preferably with r=t. As explained previously in relation to the analog-to-digital chain, making r=t allows ease of retrofit to an existing architecture.

As noted above, the functions of the single-bit to multi-bit converter 210 and processing block 220 could be merged. Also, in some applications the interpolation filtering 310, or even blocks 310 and 320, may be removed.

The invention is not limited to the embodiments described herein, which may be modified or varied without departing from the scope of the invention.

What is claimed is:

1. An analog-to-digital converter comprising:
  a first section having a multi-bit analog to digital converter for receiving an analog input signal and generating an m-bit digital signal, and
  an m-bit to n-bit converter (where m>n) for receiving the m-bit digital signal and for generating an n-bit digital output signal for outputting across an interface, wherein the m-bit to n-bit converter quantizes the m-bit signal to a lower resolution; and
  a second section having processing means which is arranged to receive the n-bit digital signal and to process the received signal to generate an output digital signal.

2. An analog-to-digital converter according to claim 1 wherein the multi-bit analog to digital converter is a multi-bit sigma-delta modulator.

3. An analog-to-digital converter according to claim 1 wherein the m-bit to n-bit converter is an m-bit to single-bit converter.

4. An analog-to-digital converter according to claim 1 wherein the m-bit to n-bit converter receives the m-bit digital signal at substantially the same rate as it outputs the n-bit digital signal.

5. An analog-to-digital converter according to claim 1 wherein the m-bit to n-bit converter is a noise-shaping converter.

6. An analog-to-digital converter according to claim 5 wherein the m-bit to n-bit converter is a digital sigma-delta modulator.

7. An analog-to-digital converter according to claim 1 wherein the processing means comprises an n-bit to p-bit converter for receiving the n-bit digital signal from the interface and for generating a p-bit digital signal, where n<p; and filtering which filters the p-bit signal to generate a digital output.

filtering means for filtering the p-bit signal to generate a digital output.

8. An analog-to-digital converter according to claim 7 wherein the n-bit to p-bit converter is a single-bit to p-bit converter.

9. An analog-to-digital converter according to claim 7 wherein the n-bit to p-bit converter receives the n-bit digital signal at substantially the same rate as it outputs the p-bit digital signal.

10. An analog-to-digital converter according to claim 7 wherein m=p.

11. An analog-to-digital converter according to claim 7 wherein the filtering means comprises a decimator.

12. An analog-to-digital converter according to claim 1 wherein the first section is located on a first integrated circuit and the second section is located on a second integrated circuit.

13. An analog-to-digital converter according to claim 12, wherein the first integrated circuit and second integrated circuit are separately packaged.

14. An analog-to-digital converter according to claim 12 wherein the first and second integrated circuits are housed within a common package.

15. An analog-to-digital converter according to claim 1 wherein the second section is formed using a manufacturing geometry which is different than that of the first section.

16. An analog-to-digital converter according to claim 15 wherein the second section is formed using a manufacturing geometry which is of finer geometry than that of the first section.

17. An analog-to-digital converter according to claim 1, further including apparatus comprising an output stage thereof, the apparatus comprising:
an input for receiving an n-bit signal from said analog-to-digital converter,
a processor which converts the n-bit digital signal into a p-bit digital signal, where n<p; and
a filter arranged to receive the p-bit signal and generate a digital output therefrom.

18. A digital-to-analog converter comprising:
a first section having an input for receiving an s-bit digital signal from an interface and for generating a t-bit digital signal, where s<t,
a digital-to-analog converter which receives the t-bit digital signal and generates an analog output; and
a second section connectable to said first section by said interface and having an input for receiving a digital signal a processor which receives the digital input signal and generates an s-bit digital output signal.

19. A digital-to-analog converter according to claim 18 wherein the first section receives the s-bit digital signal at substantially the same rate as it outputs the t-bit digital signal.

20. A digital-to-analog converter according to claim 18 wherein the s-bit to t-bit converter is a single-bit to t-bit converter.

21. A digital-to-analog converter according to claim 18 wherein the processor comprises:
means for generating an r-bit digital signal; and,
an r-bit to s-bit converter (where r>s) for receiving the r-bit digital signal and for generating an s-bit output signal for outputting across the interface, the converter thus quantizing the r-bit signal to a lower resolution.

22. A digital-to-analog converter according to claim 21 wherein the r-bit to s-bit converter is an r-bit to single-bit converter.

23. A digital-to-analog converter according to claim 21 wherein the r-bit to s-bit converter receives the r-bit signal at substantially the same rate as it outputs the s-bit signal.

24. A digital-to-analog converter according to claim 21 wherein the r-bit to s-bit converter is a noise-shaping converter.

25. A digital-to-analog converter according to claim 24 wherein the noise-shaping converter is a sigma-delta modulator.

26. A digital-to-analog converter according to claim 21 wherein the processing means comprises a further converter for receiving a multi-bit digital signal and for generating the r-bit digital signal.

27. A digital-to-analog converter according to claim 21 wherein r=t.

28. A digital-to-analog converter according to claim 18 wherein the processing means comprises an interpolation filter.

29. A digital-to-analog converter according to claim 18 wherein the second section is located on a first integrated circuit and the first section is located on a second integrated circuit.

30. A digital-to-analog converter according to claim 29 wherein the first integrated circuit and second integrated circuit are separately packaged.

31. A digital-to-analog converter according to claim 29 wherein the first integrated circuit and second integrated circuit are housed within a common package.

32. A digital-to-analog converter according to claim 18 wherein the first section is formed using a manufacturing geometry which is different than that used for the second section.

33. A digital-to-analog converter according to claim 32 wherein the first section is formed using a manufacturing geometry which is coarser than the first section.

34. Signal processing apparatus in the form of an integrated circuit which comprises the analog-to-digital converter of claim 1 and the digital-to-analog converter of claim 18.

35. A digital-to-analog converter according to claim 18, further including apparatus comprising an input stage thereof, the apparatus comprising:
a converter for converting an r-bit digital signal to an s-bit digital signal (where r>s) which is output to said interface.

36. Signal processing apparatus in the form of an integrated circuit which comprises the converter of claim 17 and the converter of claim 35.

37. A method of processing an analog signal to generate a digital signal comprising the acts of:
receiving an analog input signal and generating an m-bit digital signal in a multi-bit analog-to-digital converter;
converting the m-bit digital signal into an n-bit digital output signal (where m>n) for outputting across an interface, wherein the converting quantizes the m-bit signal to a lower resolution; and
receiving the n-bit digital output signal across said interface and processing the received n-bit digital signal to generate an output digital signal.

38. A method of processing a digital input signal to generate an analog output signal comprising the acts of:
in a first section receiving an s-bit digital signal from an interface;
generating from the s-bit digital signal into a t-bit digital signal (where s<t) at a higher resolution and,
converting the t-bit digital signal into an analog output signal; and
in a second section, at an input, receiving a digital input signal, and processing the digital input signal to generate said s-bit digital signal and to deliver said s-bit signal to said interface.

39. Signal processing apparatus for converting a signal between the analog and digital domains comprising an input section and an output section which are connectable to one another by an interface:

the input section comprising means for converting an input signal into a multi-bit digital format, an input converter for quantizing the multi-bit signal so as to generate a lower resolution digital signal which can be sent across the interface;

an output converter for converting the lower resolution signal into a higher resolution signal; and a processor that processes the higher resolution signal to derive an output signal.

40. Signal processing apparatus according to claim 39 wherein the input converter is a noise-shaping converter.

41. Signal processing apparatus according to claim 40 wherein the noise-shaping converter is a sigma-delta modulator.

42. Signal processing apparatus according to claim 39 wherein the lower resolution digital signal is a single-bit signal.

* * * * *